US010044354B2

(12) United States Patent
Nitta

(10) Patent No.: US 10,044,354 B2
(45) Date of Patent: Aug. 7, 2018

(54) I/O CELL

(71) Applicant: Shoichi Nitta, Osaka (JP)

(72) Inventor: Shoichi Nitta, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/637,174

(22) Filed: Jun. 29, 2017

(65) Prior Publication Data
US 2018/0013433 A1    Jan. 11, 2018

(30) Foreign Application Priority Data

Jul. 11, 2016 (JP) ................................ 2016-137124
Mar. 17, 2017 (JP) ................................ 2017-052532

(51) Int. Cl.
*H03K 19/0185* (2006.01)
*H04L 25/02* (2006.01)
*H03K 17/687* (2006.01)
*H03K 5/01* (2006.01)
*H03K 19/0175* (2006.01)

(52) U.S. Cl.
CPC ....... *H03K 19/018507* (2013.01); *H03K 5/01* (2013.01); *H03K 17/687* (2013.01); *H03K 19/0175* (2013.01); *H03K 19/018585* (2013.01); *H04L 25/0272* (2013.01)

(58) Field of Classification Search
CPC ........... H03K 19/0175; H03K 19/0185; H03K 19/018507; H03K 19/018585; H03K 17/687; H03K 17/6871
See application file for complete search history.

(56) References Cited

U.S. PATENT DOCUMENTS 5,442,307 A * 8/1995 Shigehara ...... H03K 19/018507
326/24
5,808,492 A * 9/1998 Chow .................. H03K 17/164
327/108

(Continued)

FOREIGN PATENT DOCUMENTS

JP      H04-154315      5/1992
JP      2002-320380     10/2002

(Continued)

*Primary Examiner* — Jason M Crawford
(74) *Attorney, Agent, or Firm* — IPUSA, PLLC

(57) ABSTRACT

An I/O cell includes a reference output circuit that has a reference output transistor, connected to an output terminal, and has a reference pre-buffer, the reference pre-buffer driving the reference output transistor according to an input signal of the input terminal; adjustment output circuits that have an adjustment output transistor, connected to the output terminal and connected in parallel with the reference output transistor, and have an adjustment pre-buffer, the adjustment pre-buffer driving the adjustment output transistor according to the input signal; and a gate voltage detection control circuit that monitors all of gate voltages applied to the output transistors included in the reference output circuit and the adjustment output circuit. The gate voltage detection control circuit generates a timing when all of the output transistors are turned OFF when switching the H/L level of the output current to the load according to the change of the input signal.

18 Claims, 11 Drawing Sheets

(56) References Cited

U.S. PATENT DOCUMENTS

| | | | |
|---|---|---|---|
| 5,877,647 A * | 3/1999 | Vajapey | H03F 1/523 |
| | | | 326/27 |
| 6,351,172 B1 * | 2/2002 | Ouyang | H03K 19/00384 |
| | | | 327/112 |
| 6,373,287 B1 * | 4/2002 | Matsumoto | H03K 19/018585 |
| | | | 326/83 |
| 6,713,992 B2 | 3/2004 | Matsuo et al. | |
| 7,202,644 B2 | 4/2007 | Nitta et al. | |
| 7,391,189 B2 | 6/2008 | Nitta et al. | |
| 7,440,340 B2 * | 10/2008 | Hwang | G11C 5/147 |
| | | | 365/189.09 |
| 7,501,802 B2 | 3/2009 | Nitta et al. | |
| 7,570,034 B2 | 8/2009 | Nitta et al. | |
| 7,956,646 B2 * | 6/2011 | Osawa | H03K 19/01714 |
| | | | 326/119 |
| 2002/0030517 A1 * | 3/2002 | Kurisu | H03K 19/0005 |
| | | | 327/108 |

FOREIGN PATENT DOCUMENTS

| | | |
|---|---|---|
| JP | 2003-017997 | 1/2003 |
| JP | 2006-006004 | 1/2006 |
| JP | 2006-149198 | 6/2006 |
| JP | 4054714 | 3/2008 |
| JP | 5246251 | 7/2013 |

\* cited by examiner (n IS INTEGER)

I/O CELL

BACKGROUND OF THE INVENTION

1. Field of the Invention

The present invention relates to an I/O cell capable of switching an output current.

2. Description of the Related Art

In recent years, an I/O cell is used for an input/output of an LSI. It is required for the I/O cell, as an interface between two circuit blocks, which operate with different power-supply voltages, to be capable of switching output drive capabilities (output voltages). Here, as a method for switching output voltages, a method is known in which ON/OFF states of output transistors of different channels (Pch, Nch) are switched.

However, when switching the output transistors, if both channel transistors (Tr) are ON, then, a through current flows.

With respect to the above, it is proposed in Patent Document 1 that, in order to prevent destruction of output transistors due to the increased through current caused by increased output power, the through current is reduced by connecting low-output-current transistors in parallel, and by switching simultaneously a high-output-current transistor and the low-output-current transistors, and thus, causing the through current to flow in the low-output-current transistors.

Further, it is proposed to adjust circuit constants of a latch circuit (pre-buffer) in order to create a period in which both a Pch output transistor and a Nch output transistor are OFF.

CITATION LIST

Patent Literature

[Patent Document 1] Japanese Laid-Open Patent Application No. H04-154315

SUMMARY OF THE INVENTION

In view of the above, an I/O cell is provided according to an embodiment.

The I/O cell is capable of switching an output current. The I/O cell includes an input terminal to which an input signal is input; an output terminal to which a load is connected; and an enabling terminal to which a control signal is input. The control signal indicates whether the output current should be a high impedance state or should be a H/L level corresponding to a logical value of the input signal. The I/O cell includes a reference output transistor that has a reference output transistor with referential first electrical characteristics, connected to the output terminal, and has a reference pre-buffer with a first circuit constant, connected to the enabling terminal, the reference pre-buffer driving the reference output transistor according to the input signal of the input terminal and the control signal of the enabling terminal and which has a first circuit constant; one or more adjustment output circuits that have an adjustment output transistor with electrical characteristics that are the same as or different from the first electrical characteristics, connected to the output terminal and connected in parallel with the reference output transistor, and have an adjustment pre-buffer with a circuit constant that is the same as or different from the first circuit constant, the adjustment pre-buffer driving the adjustment output transistor according to the input signal of the input terminal; and a gate voltage detection control circuit that monitors gate voltages applied to all of output transistors in the reference output circuit and the adjustment output circuits. The gate voltage detection control circuit, when switching a H/L level of the output current for the load according to the H/L level change of the logical value of the input signal, generates a timing for causing all of the output transistors to be turned OFF.

DETAILED DESCRIPTION OF THE PREFERRED EMBODIMENTS

Figure 1:
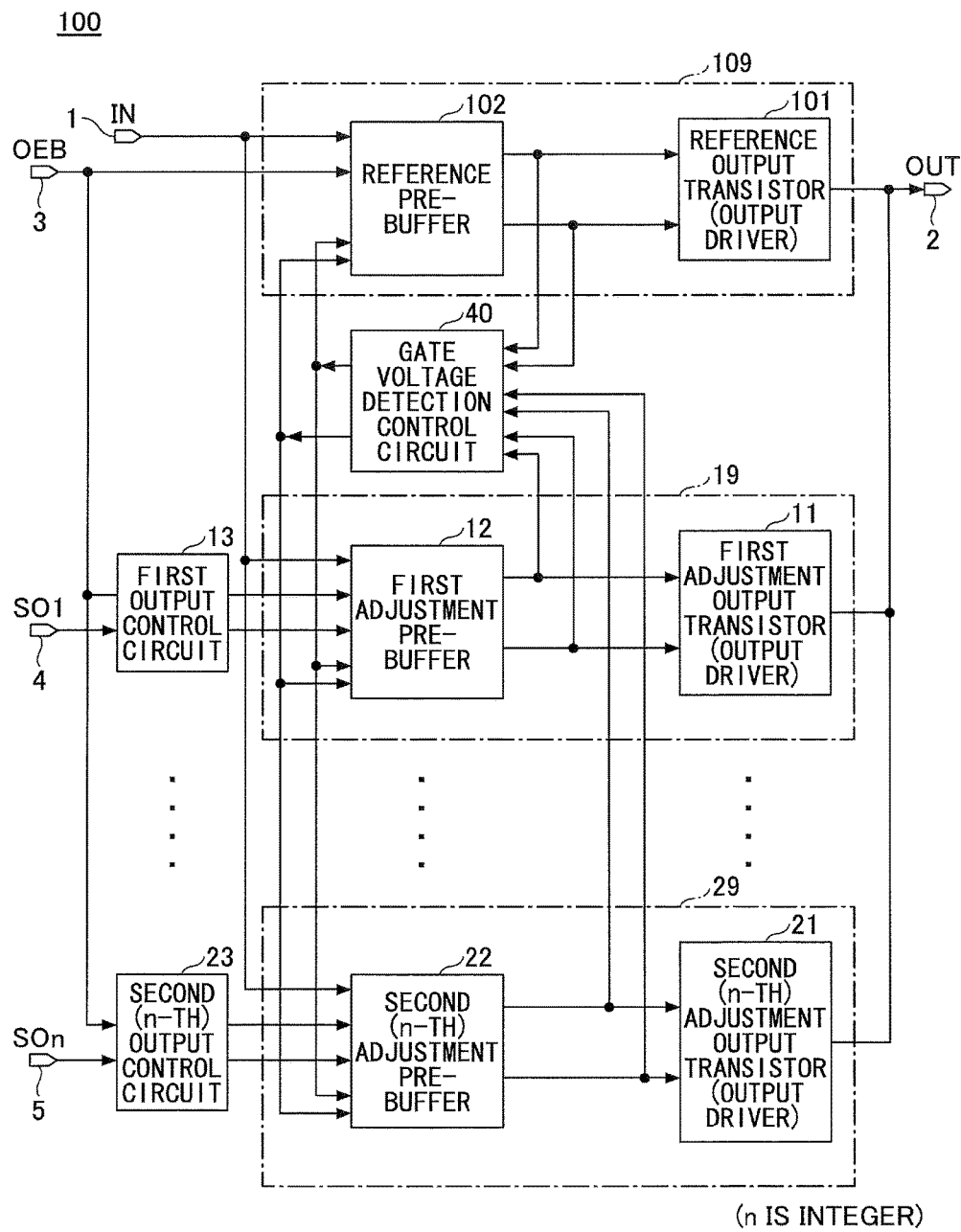
FIG. 1 is an overall block diagram of an I/O cell capable of switching output drive capability according to a first embodiment.

In view of the above, it is an object of the present invention to provide an I/O cell that is capable of switching the output voltages and capable of preventing the occurrence of the through current when the I/O cell is operated for any output voltage setting.

According to an embodiment, it is possible for an I/O cell capable of switching output voltages to prevent an occurrence of the through current when the I/O cell is operated for any output voltage setting.

In the following, embodiments of the present invention will be described referring to the drawings.

First embodiment

FIG. 1 is an overall block diagram of an I/O (Input/Output) cell 100 capable of switching output drive capability (output current) according to a first embodiment.

The I/O cell 100 includes multiple output transistors 101, 11, 21, multiple pre-buffers 102, 12, 22 corresponding to the output transistors 101, 11, 21, a gate voltage detection control circuit 40, and output control circuits 13, 23.

As illustrated in FIG. 1, in an embodiment of the present invention, the gate voltage detection control circuit (output transistor gate voltage detection circuit) 40, which does not exist in a conventional circuit, is provided which monitors gate voltages applied to all transistors and controls timings.

Further, the I/O cell 100 includes an input terminal 1 and an output terminal 2, and it is possible for the I/O cell 100 to switch an output voltage OUT output from the output terminal 2 to a load. In other words, it is possible for the I/O cell 100 to switch output drive capability.

Specifically, the output transistors (output drivers) 101, 11, 21 are each connected to the output terminal 2 to which the load is connected, and are connected in parallel with each other.

Figure 2:
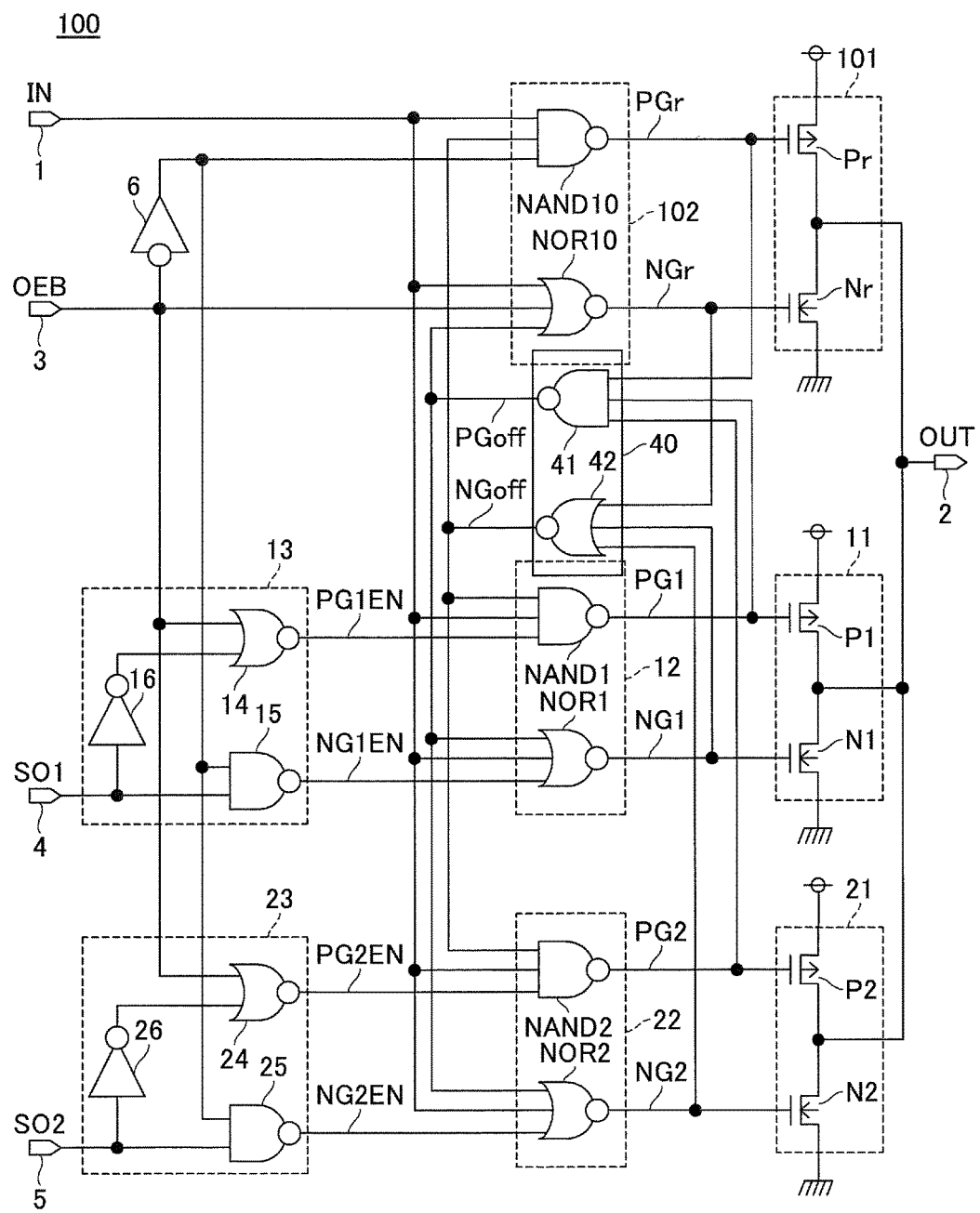
FIG. 2 is an overall circuit diagram of the I/O cell capable of switching output drive capability illustrated in FIG. 1.

Here, as illustrated in FIG. 1 and FIG. 2, a reference output transistor 101 includes a Pch transistor Pr and a Nch transistor Nr. A first adjustment output transistor 11 includes a Pch (Positive Channel) transistor P1 and a Nch (Negative Channel) transistor N1. A second adjustment output transistor 21 includes a Pch transistor P2 and a Nch transistor N2.

Further, the pre-buffers 102, 12, 22 (drive circuits) are each connected to an input terminal 1 to which an input signal IN is input. Further, the pre-buffers 102, 12, 22 are connected in parallel with each other.

Further, the I/O cell 100 includes an output enabling terminal (enabling terminal) 3 to which a control signal OEB as an output enabling signal is input. To the output enabling terminal 3, the control signal (output enabling signal) OEB, which indicates whether the output voltage OUT should be a high impedance (Hi-Z) state or should be a H/L level state corresponding to a logical value of the input signal IN, is input.

Therefore, the I/O cell 100 functions as a three state (tri-state) buffer that can output the output voltage OUT in three states: a High (H) level state, a Low (L) level state, and a high impedance (Hi-Z) state.

In the I/O cell 100, when outputting a H level output voltage OUT, the Pch transistors Pr, P1, P2 are ON and the Nch transistors Nr, N1, N2 are OFF.

When outputting a L level output voltage OUT, the Pch transistors Pr, P1, P2 are OFF and the Nch transistors Nr, N1, N2 are ON. When outputting the output voltage OUT of a high impedance (Hi-Z) state, all transistors are OFF.

The control signal (output enabling signal) OEB is directly input to the reference pre-buffer 102 and is also input to a first output control circuit 13 and a second output control circuit 23.

Further, the I/O cell includes external terminals (output current setting input terminals) 4, 5. To the external terminals, output drive capability switching signals SO1, SO2 are input. The output drive capability switching signals SO1, SO2 are used for indicating, from an external circuit, selection (setting) of a set value of the output current of the I/O cell. The output drive capability switching signals (select-out signals) SO1, SO2 are input to the first output control circuit 13 and the second output control circuit 23, respectively.

When the first output drive capability switching signal SO1 is Low, the first adjustment pre-buffer 12 turns OFF the first adjustment output transistor 11 according to the first output control circuit 13. Similarly, when the second output drive capability switching signal SO2 is Low, the second adjustment pre-buffer 22 turns OFF the second adjustment output transistor 21.

In a state described above, when the output enabling signal OEB is Low, it is an enabling state in which the output voltage OUT of the output terminal 2 changes according to a state of the input signal IN, and the output current is determined by an output current preset in the reference output transistor 101 (set current value).

Based on the states of the output drive capability switching signals 501, SO2, the output current is determined as follows.

When the output drive capability switching signal SO1 is High and SO2 is Low, the output current is "a set current value of the reference output transistor 101"+"a set current value of the first adjustment output transistor 11".

When the output drive capability switching signal SO1 is Low and SO2 is High, the output current is "a set current value of the reference output transistor 101"+"a set current value of the second adjustment output transistor 21".

Further, when the output drive capability switching signals SO1 and SO2 are High, the output current is "a set current value of the reference output transistor 101"+"a set current value of the first adjustment output transistor 11"+"a set current value of the second adjustment output transistor 21".

The gate voltage detection control circuit 40 monitors all of the gate voltages for the output transistors 101, 11, 21. When the gate voltage detection control circuit 40 switches the output signal, to the load, between the H level and the L level according to the change of the input signal IN (when the gate voltage detection control circuit 40 switches the H/L states of the output voltage to the load according to the change of the input signal), the gate voltage detection control circuit 40 creates time when all transistors are temporarily turned OFF.

FIG. 2 is an overall circuit diagram of the I/O cell 100 capable of switching output drive capability. As illustrated in FIG. 2, the output transistors (101, 11, 21) each include a Pch transistor and a Nch transistor (Pr, Nr), (P1, N1), (P2, N2).

The reference output transistor 101 drives the load by using a preset first output current (reference current). For example, in the transistors included in the reference output transistor 101, a predetermined first gate threshold voltage is preset, and thus, electrical characteristics (first characteristics) are preset in such a way that a drain current corresponding to the threshold flows as a first output current when a switch is turned ON.

The first adjustment output transistor 11 drives the load by using the first output current equal to the reference current. For example, in the transistors included in the first adjustment output transistor 11, the predetermined first gate threshold voltage is preset, and thus, the electrical characteristics (first characteristics) are preset in such a way that a drain current corresponding to the threshold flows as the first output current when a switch is turned ON.

The second adjustment output transistor 21 drives the load by using a second output current different from the first output current. In other words, the transistors included in the second output transistor 21 have second electrical characteristics different from the first electrical characteristics of the transistors included in the first adjustment output transistors 11 with respect to a certain electrical characteristic (e.g., size).

It should be noted that, in the present embodiment, the first output current equal to the reference current set in the reference output transistor 101 is set in the first adjustment output transistor 11. However, the first output current may be set in the second adjustment output transistor 21. Further, only a single adjustment output transistor may be included. In this case, the electrical characteristics of the adjustment output transistor may be different from or the same as the first electrical characteristics.

A pair of the reference pre-buffer (drive circuit) 102 and the reference output transistor 101 is included in a reference output circuit 109. A pair of the first adjustment pre-buffer 12 and the first adjustment output transistor 11 is included in a first adjustment output circuit 19. A pair of the second adjustment pre-buffer 22 and the second adjustment output transistor 21 is included in a second adjustment output circuit 29.

The first adjustment output circuit 19 and the second adjustment output circuit 29 are used for adjusting a multiplication factor with respect to the referential output of the reference output circuit 109.

The reference pre-buffer 102, the first adjustment pre-buffer 12 and the second adjustment pre-buffer 22 drive and control the reference output transistor 101, the first adjustment output transistor 11, and the second adjustment output transistor 21, respectively, according to a logical value of the input signal IN of the input terminal 1.

Here, the second output transistor 21 as a drive target of the second adjustment pre-buffer 22 has electrical characteristics different from those of the reference output transistor 101 (e.g., size). Therefore, the second adjustment pre-buffer 22 has a circuit constant (second circuit constant) different from a circuit constant (first circuit constant) of the reference pre-buffer 102 (e.g., size). It should be noted that the first adjustment pre-buffer 12 has a circuit constant the same as the first circuit constant of the reference pre-buffer 102.

As illustrated in FIG. 2, the reference pre-buffer 102 is connected in series to the reference output transistor 101, and drives and controls transistors Pr, Nr included in the connected reference output transistor 101. The first adjustment pre-buffer 12 is connected in series to the first adjustment output transistor 11, and drives and controls transistors P1, N1 included in the connected first adjustment output transistor 11. The second adjustment pre-buffer 22 is connected in series to the second adjustment output transistor 21, and drives and controls transistors P2, N2 included in the connected second adjustment output transistor 21.

The reference pre-buffer, the first adjustment pre-buffer, and the second adjustment pre-buffer (102, 12, 22) includes NAND circuits (NAND10, NAND1, NAND2) and NOR circuits (NOR10, NOR1, NOR2), respectively.

The NAND10, NAND1, NAND2 are electrically connected to gate terminals of the Pch transistors Pr, P1, P2, respectively. Output signals of the NAND10, NAND1, NAND2 are Pch gate voltages PGr, PG1, PG2 that indicate ON/OFF switching of the Pch transistors Pr, P1, P2. The gate voltages PGr, PG1, PG2 output from the NAND10, NAND1, NAND2 are L levels when all signals input to the NAND10, NAND1, NAND2 are H, and are H levels otherwise.

The P channel transistors Pr, P1, P2 are turned ON when Pch gate voltages PGr, PG1, PG2 are L (e.g., 0 V), and are turned OFF when Pch gate voltages PGr, PG1, PG2 are H (e.g., positive value).

On the other hand, the NOR10, NOR1, NOR2 are electrically connected to gate terminals of the Nch transistors Nr, N1, N2, respectively, and output signals of the NOR10, NOR1, NOR2 are Nch gate voltages (NGr, NG1, NG2) that indicate ON/OFF switching of the Nch transistors Nr, N1, N2. The gate voltages NGr, NG1, NG2 output from the NOR10, NOR1, NOR2 are H levels when all signals input to the NOR10, NOR1, NOR2 are L, and are L levels otherwise.

The N channel transistors Nr, N1, N2 are turned ON when the Nch gate voltages NGr, NG1, NG2 are H (e.g., positive value), and are turned OFF when the Nch gate voltages NGr, NG1, NG2 are L (e.g., 0 V).

Here, when the output enabling signal OEB, input to the output enabling terminal 3, is High, it is a non-enabling (H level) state which indicates that the output voltage OUT should be a high impedance state. It should be noted that an enabling state (L level enabling state) indicates that the output voltage OUT should be changed to a H/L level reflecting the logical value (H/L) of the input signal IN.

The control signal OEB is input to the first adjustment pre-buffer 12 and the second adjustment pre-buffer 22 via the first control circuit 13 and the second control circuit 23, respectively, and is directly input to the reference pre-buffer 102. In other words, at the former stage of the reference pre-buffer 102, an output control circuit is not included.

With the above arrangement, in the case where the control signal OEB indicates a non-enabling state, a H level signal is directly input to the NOR10 of the reference pre-buffer 102, and thus, regardless of the state of the input signal IN, the gate voltage NGr output from the NOR10 never becomes H, and the Nch transistor Nr keeps an OFF state.

At the same time, in the case where the control signal OEB indicates a non-enabling state, a H level signal is reversed via a control inverter 6 and a L level signal is input to the NAND10 of the reference pre-buffer 102, and thus, regardless of the state of the input signal IN, the gate voltage PGr output from the NAND10 never becomes L, and the Pch transistor Pr keeps an OFF state.

The gate voltage detection control circuit 40 detects all of the gate voltages. In the case of the above non-enabling state, the gate voltage NGr is L and the gate voltage PGr is H, and thus, a timing control signal PGoff does not become H and a timing control signal NGoff does not become L, and thus, the timing control signals PGoff and NGoff do not become a trigger, and thus, all transistors keeps the OFF state.

Therefore, in the case where the control signal OEB indicates a non-enabling state, regardless of the state of the input signal IN, the output voltage is in a high impedance state.

Additionally, the first output control circuit 13 and the second output control circuit 23, located at the former stage of the first adjustment pre-buffer 12 and the second adjustment pre-buffer 22, detect output drive capability switching signals SO1, SO2 which indicate activation and deactivation of the first adjustment output transistor (output driver) 11 and the second adjustment output transistor (output driver) 21.

According to settings input from outside to external terminals (input terminals for output current setting) 4, 5, the output drive capability switching signals SO1, SO2 indicate H when the connected first and second adjustment output transistors 11, 21 should be activated (should be changed to a H/L level reflecting the logical value (H/L) of the input signal IN), and indicate L when the first and second adjustment output transistors 11, 21 should be deactivated (should be in a high impedance state). As described above, according to the output drive capability switching signals SO1, SO2, the drive capability of the I/O cell 100 (the set value of the output current) is switched.

The first and second output control circuits 13, 23 includes NOR circuits 14, 24, NAND circuits 15, 25, and inverters (NOT) 16, 26, respectively.

The first output drive capability switching signal SO1 and the control signal OEB are input to the first output control circuit 13. When the first output drive capability switching signal SO1 indicates that the first adjustment output transistor 11 should be activated (when SO1 is H), the first output control circuit 13 outputs signals PG1EN, NG1EN corresponding to the control signal OEB to the first adjustment pre-buffer 12. In this state, a set value of the output current of the I/O cell 100 is a total in which at least a set current value of the first adjustment output transistor 11 is added to a set current value of the reference output transistor 101.

The second output drive capability switching signal SO2 and the control signal OEB are input to the second output control circuit 23. When the second output drive capability switching signal SO2 indicates that the second adjustment output transistor 21 should be activated (when SO2 is H), the second output control circuit 23 outputs signals PG2EN, NG2EN corresponding to the control signal OEB to the second adjustment pre-buffer 22. In this state, a set value of the output current of the I/O cell 100 is a total in which at least a set current value of the second adjustment output transistor 21 is added to a set current value of the reference output transistor 101.

It should be noted that, when the output drive capability switching signals SO1, SO2 are L indicating that the first adjustment output circuit 11 and the second adjustment output circuit 21 should be deactivated (when SO1, SO2 are L), the signals PG1EN, PG2EN output from the NOR circuits 14, 24 are always L regardless of the state of the control signal OEB, and thus, the NAND1, NAND2 of the adjustment pre-buffers 12, 22 are not turned ON, and the Pch transistors P1, P2 are not turned ON.

Similarly, when the output drive capability switching signals SO1, SO2 are L indicating that the first adjustment output circuit 11 and the second adjustment output circuit 21 should be deactivated (when SO1, SO2 are L), the signals NG1EN, NG2EN output from the NAND circuits 15, 25 are always H, and thus, the NOR1, NOR2 of the adjustment pre-buffers 12, 22 are not turned ON, and the Nch transistors N1, N2 are not turned ON.

Therefore, when the output drive capability switching signals SO1, SO2 are L indicating that the first adjustment output circuit 11 and the second adjustment output circuit 21 should be deactivated (when SO1, SO2 are L), regardless of the states of the control signal OEB and the input signal IN, the output signals of the first and the second adjustment output transistors 11, 21 are in a high impedance state. In this state, a set value of the output current of the I/O cell is equal to the set current value of the reference output transistor 101, and, in the case where the drive capabilities of all of the output circuits are positive, the set value of the output current of the I/O cell is the lowest.

Conversely, when the output drive capability switching signals SO1, SO2 are H indicating that the first adjustment output circuit 11 and the second adjustment output circuit 21 should be activated, the first output control circuit 13 and the second output control circuit 23 output the signals PG1EN, NG1EN, PG2EN, NG2EN corresponding to the control signal OEB, reflecting the logical value (H/L) of the control signal OEB. In this state, a set value of the output current of the I/O cell 100 is a total of the set current value of the reference output transistor 101, the set current value of the first adjustment output transistor 11, and the set current value of the second adjustment output transistor 21. Here, in the case where the drive capabilities of all of the output circuits are positive, the set value of the output current of the I/O cell is the highest.

As illustrated in FIG. 2, the gate voltage control circuit 40 monitors all of the gate voltages PGr, PG1, PG2, NGr, NG1, NG2 for the transistors (Pr, P1, P2, Nr, N1, N2), and outputs timing control signals PGoff, NGoff.

The gate voltage detection control circuit 40 includes a NAND circuit (detection NAND) 41 and a NOR circuit (detection NOR) 42.

Specifically, all of the Pch gate voltages PGr, PG1, PG2, which drive and control the Pch transistors, are input to the detection NAND 41 of the gate voltage detection control circuit 40, and, when all of the Pch gate voltages PGr, PG1, PG2 are H, a L level timing control signal PGoff is output. In other words, the timing control signal PGoff as an output signal is L only when all of the gate voltages (PGr, PG1, PG2) for the output Pch transistors (Pr, P1, P2) are a H level.

Therefore, the L level timing control signal PGoff indicates that all of the Pch transistors Pr, P1, P2 are OFF, and functions as a Nch timing control signal that triggers a timing for turning ON the Nch transistors Nr, N1, N2.

Further, all of the Nch gate voltages NGr, NG1, NG2, which drive and control the Nch transistors, are input to the detection NOR circuit 42 of the gate voltage detection control circuit 40, and, when all of the Nch gate voltages NGr, NG1, NG2 are L, a H level timing control signal NGoff is output. In other words, the timing control signal NGoff is H only when all of the gate voltages (NGr, NG1, NG2) applied to the output Nch transistors (Nr, N1, N2) are L level.

The H level timing control signal NGoff indicates that all of the Nch transistors Nr, N1, N2 are OFF, and functions as a Pch timing control signal that triggers a timing for turning ON the Pch transistors Pr, P1, P2.

Therefore, the NAND10, NAND1, NAND2 included in the reference pre-buffer 102, the first adjustment pre-buffer 12, and the second adjustment pre-buffer 22 output L level Pch gate voltages PGr, PG1, PG2, respectively, and turn ON the Pch transistors Pr, P1, P2 when all of the input signal IN, the control signal OEB or the signals PG1EN, PG2EN corresponding to the control signal, and the timing control signal NGoff are H.

Further, the NOR circuits NOR10, NOR1, NOR2 included in the pre-buffers 102, 12, 23 output H level Nch gate voltages NGr, NG1, NG2 and turn ON the Nch transistors Nr, N1, N2 when all of the input signal IN, the control signal OEB or the signals NG1EN, NG2EN corresponding to the control signal, and the timing control signal PGoff are L.

Here, as described above, the reference output transistor 101 and the first output transistor 11 have the same output current, and the second output transistor 21 has electrical characteristics different from the reference output transistor 101 and the first output transistor 11, and has a different output current. Specifically, each of the output transistors is a MOSFET (metal-oxide-semiconductor field-effect transistor). Here, gate threshold voltages required for turning ON the FET (transistors) are different between the Pch transistor P2 and the Pch transistors Pr, P1. Further, gate threshold voltages are different between the Nch transistor N2 and the Nch transistors Nr, N1.

Therefore, the reference pre-buffer 102 and the first adjustment pre-buffer 12 have the same circuit constant. The second adjustment pre-buffer 22 has a circuit constant different from that of the reference pre-buffer 102 and the first adjustment pre-buffer 12. For example, characteristics of parts including diodes, transistors, etc., or combinations thereof included in the NAND circuit (NAND2) and the NOR circuit (NOR2) included in the second adjustment pre-buffer 22 are different from those of the parts or combinations thereof included in the NAND10, NAND1, NOR10, NOR1 included in the reference pre-buffer 102 and the first adjustment pre-buffer 12, and thus, output signal switching times are different.

Therefore, rise times of voltage and current are different between the reference output circuit and the first adjustment output circuit 109, 19 and the second adjustment output circuit 29.

Here, in the I/O cell 100 according to the present embodiment, the Pch transistors are operated in the case of performing a H level output, and Nch transistors are operated in the case of performing a L level output.

As described above, the gate voltage detection control circuit 40 monitors all of the gate voltages applied to the output transistors 11, 21, 101. When the gate voltage detection control circuit 40 switches the output signal, to the load, between the H level and the L level according to the change of the input signal IN (when the gate voltage detection control circuit 40 switches the H/L states of the output voltage to the load according to the change of the input signal), the gate voltage detection control circuit 40 creates time when all transistors are temporarily turned OFF.

A difference between turning OFF times of the transistors are caused by differences of rising start timings and falling start timings due to differences in electrical characteristics and circuit constants between the first output circuit and the second output circuit.

Further, the gate voltage detection control circuit 40 may include a delay circuit, included at the latter stage of the detection NAND 41, for delaying an output of the Nch timing control signal PGoff, and a delay circuit, included at the latter stage of the detection NOR circuit 42, for delaying an output of the Pch timing control signal NGoff. With the above arrangement, it is possible to reliably create the predetermined time when all transistors are OFF (refer to "Off-Off R", "Off-Off F" in FIG. 3).

With the above arrangement, it is possible to prevent occurrence of the through current when the output signal OUT changes from H to L and when the output signal OUT changes from L to H.

Figure 3:
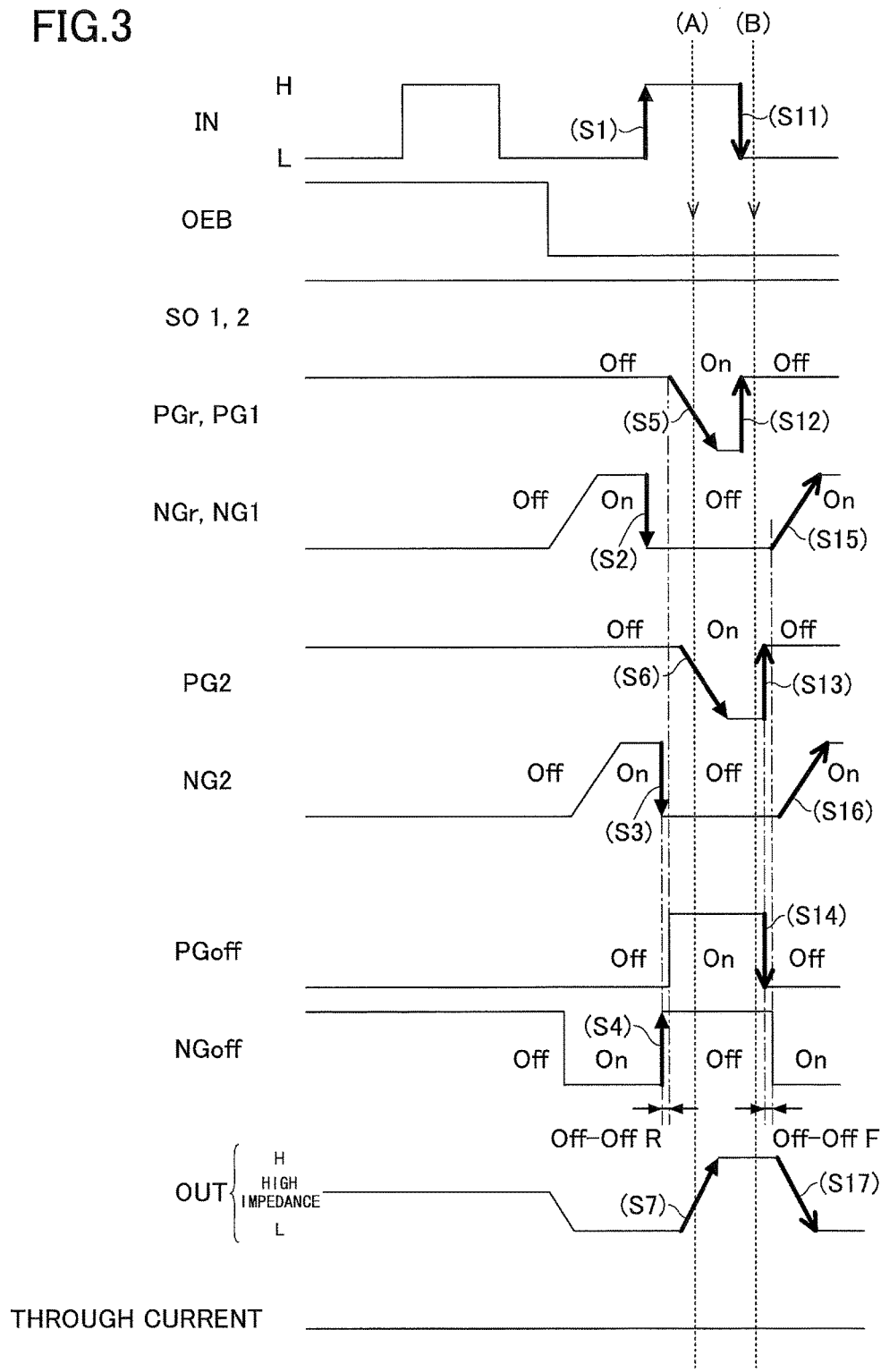
FIG. 3 is a timing chart illustrating changes of signals illustrated in FIG. 2.
Figure 4:
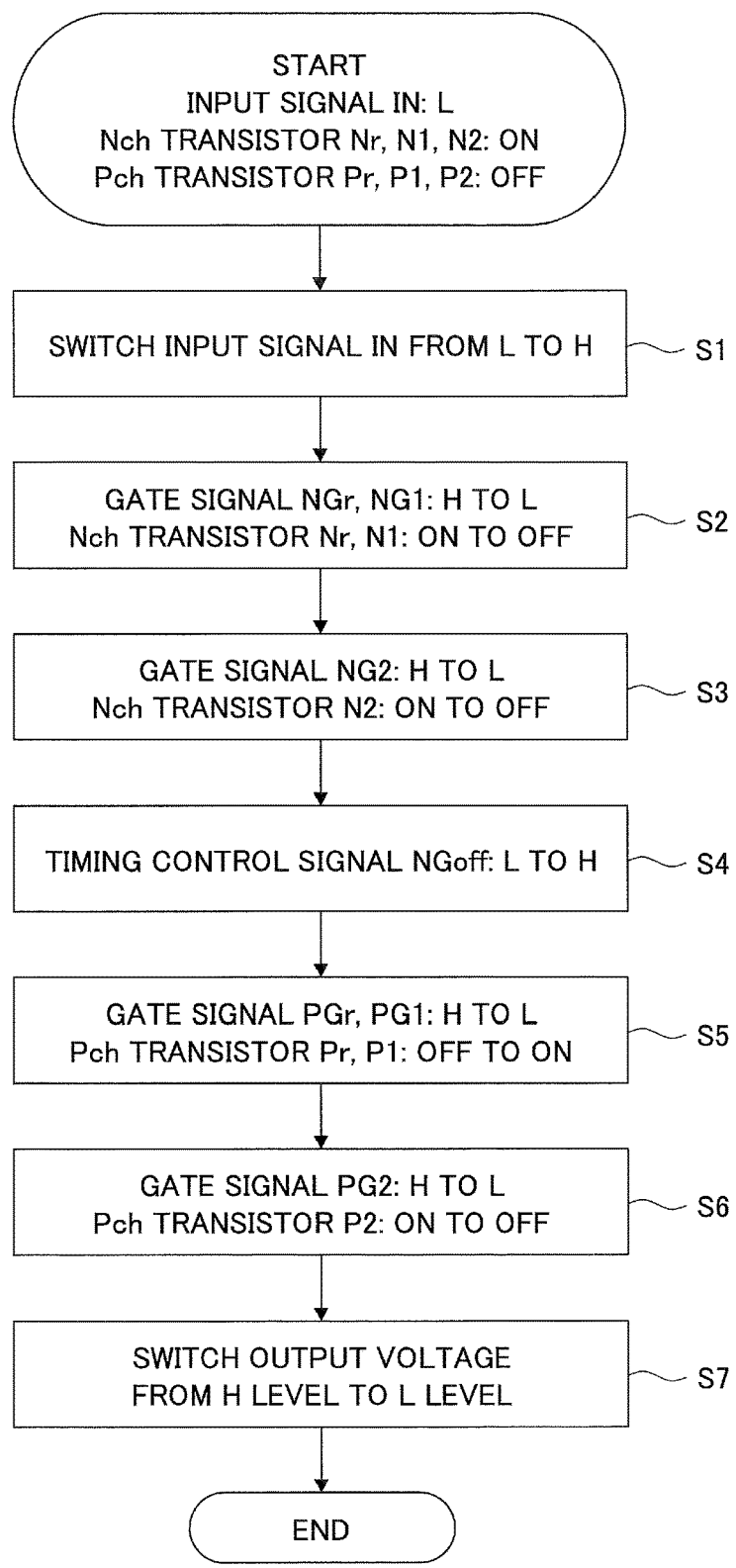
FIG. 4 is a flowchart of an operation for switching an input signal from L to H in FIG. 3.
Figure 5:
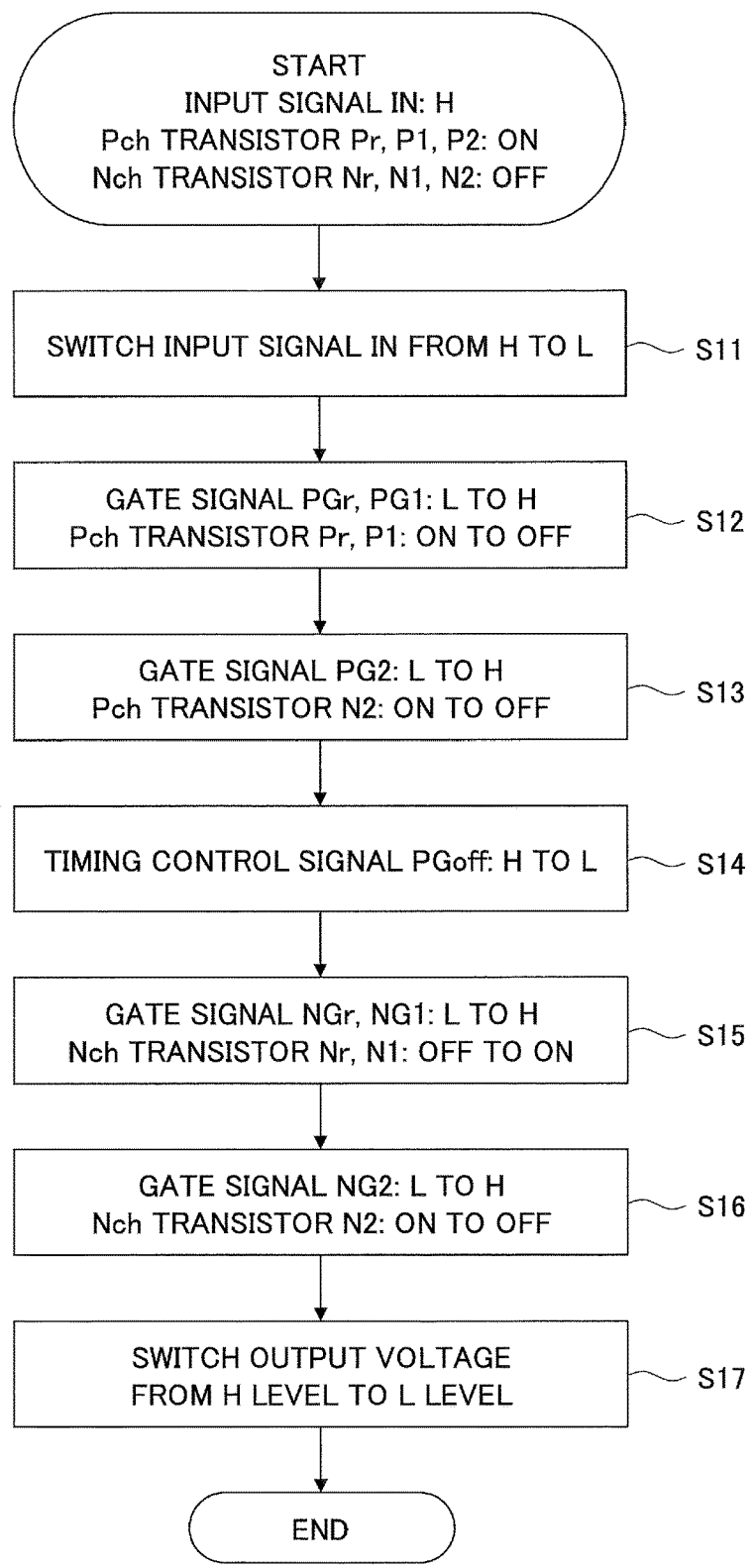
FIG. 5 is a flowchart of an operation for switching an input signal from H to L in FIG. 3.

Referring to FIG. 3 to FIG. 5, an output switching method in the case of switching the output voltage (output drive) will be described.

FIG. 3 is a timing chart illustrating changes of signals illustrated in FIG. 2. FIG. 4 is a flowchart of an operation for switching the input signal from L to H in FIG. 3, and FIG. 5 is a flowchart of an operation for switching the input signal from H to L in FIG. 3.

FIG. 3 to FIG. 5 illustrate an example in which changes of the gate voltages PG2 and NG2, output from the second adjustment pre-buffer 22, applied to the second output transistor 21, are delayed compared with those of the gate voltages PG1 and NG1 applied to the first output transistor 11 and those of the reference gate voltages PGr and NGr applied to the reference output transistor 101.

First, it is determined whether or not the output drive capability switching signals SO1, SO2 indicate that the first and the second adjustment output transistors 11, 12 (output drivers) should be activated. In a case where the output drive capability switching signals SO1, SO2 are L, the case indicates that the first adjustment output circuit 11 and the second adjustment output circuit 21 should be deactivated. Therefore, regardless of the states of the control signal OEB and the input signal IN, the output signals of the first and the second adjustment output transistors 11, 21 are to be in a high impedance state.

Further, it is determined whether the control signal OEB is L (enabling state). In a case where the control signal OEB is H, the case indicates a non-enabling state. Therefore, regardless of the state of the input signal IN, an output of the reference transistor 101 of the reference output circuit 109 is to be also in a high impedance state.

<L to H Operation>

Referring to FIG. 3 and FIG. 4, an operation in a case where the output signal (output voltage) OUT changes from L to H will be described. When the input signal IN changes from L to H in a state where the output drive capability switching signals SO1, SO2 are H indicating that the first and the second adjustment output transistors 11, 12 should be activated and where the control signal OEB is L indicating an output enabling state, the circuits operate in such a way that the output signal OUT changes from L to H.

In this operation, when the input signal IN changes from L to H (S1), the gate voltages NGr, NG1, output from the NOR10, NOR1, changes from H to L because the input signal IN, input to the NOR10, NOR1 of the pre-buffers 102, 12, has become not L (S2).

Slightly delayed, the Nch gate voltage NG2, output from the NOR2 of the second adjustment pre-buffer 22, changes from H to L (S3). The delay is caused by switching speed difference due to transistor size difference and pre-buffer circuit constant difference.

Further, the NOR circuit 42 of the gate voltage detection control circuit 40 outputs a H level Pch timing control signal NGoff after all of the Nch gate voltages NG1, NG2, NGr have become L. In other words, the timing control signal NGoff changes from L to H after waiting for the second output circuit whose change is slower (S4).

Afterwards, because the input timing control signal NGoff has changed from L to H, the Pch gate voltages PGr, PG1 output from the NAND10, NAND1 of the pre-buffers 102, 12 change from H to L (S5). This switches ON the Pch transistors Pr, P1

Here, a period from after S4 to just before S5 is an Off-Off period in which all of the output transistors are OFF (FIG. 3: Off-Off R). In FIG. 3, the switching time is illustrated longer for the sake of understanding convenience. Although the switching time, in which all of the output transistors are OFF, is an instantaneous time during the switching operation, the order of the changes is determined by detection and monitoring, and thus, the order the changes does not change.

It should be noted that, in order to make the Off-Off R period longer, a delay circuit may be included at the latter stage of the NOR circuit 42 of the gate voltage detection control circuit 40. Further, as will be described in a second embodiment, a latch circuit may be included at the former stage of the output control circuits 13, 23.

Slightly delayed, the Pch gate voltage PG2, output from the NAND2, changes from H to L (S6). This switches ON the Pch transistor P2.

Afterwards, the output signal OUT changes from L to H (S7).

<H to L Operation>

Referring to FIG. 3 and FIG. 5, an operation in a case where the output signal (output voltage) OUT changes from H to L will be described. When the input signal IN changes from H to L in a state where activation of the adjustment output circuits 19, 29 is indicated (SO1, SO2 are H) and where the control signal OEB is L indicating an output enabling state, the circuits operate in such a way that the output signal OUT changes from H to L.

First, when the input signal IN changes from H to L (S11), the gate voltages PGr and PG1, output from the NAND10 and NAND1, changes from L to H (S12) because the input signal IN, input to the NAND10 and NAND1 of the pre-buffers 102, 12, has become not H.

Slightly delayed, the Pch gate voltage PG2, output from the NAND2 of the second adjustment pre-buffer 22, changes from L to H (S13). The delay is caused by switching speed difference due to transistor size difference and pre-buffer circuit constant difference.

Further, the NAND circuit 41 of the gate voltage detection control circuit 40 outputs a L level Nch timing control signal PGoff after all of the Pch gate voltages PG1, PG2, PGr have become H. In other words, the timing control signal PGoff changes from H to L after waiting for the second output circuit whose change is slower (S14).

The change of the timing control signal PGoff serves as a trigger. In response to the change of the input timing control signal PGoff from H to L, the Nch gate voltages NGr and NG1, output from the NOR10 and NOR1 of the pre-buffers 102 and 12, changes from L to H (S15). This switches ON the Nch transistors Nr, N1.

Here, a period from after S14 to just before S15 is an Off-Off period in which all of the output transistors are OFF (FIG. 3: Off-Off F). In FIG. 3, the switching time is illustrated longer for the sake of understanding convenience. Although the switching time, in which all of the output transistors are OFF, is an instantaneous time during the switching operation, the order of the changes is determined by detection and monitoring, and thus, the order the changes does not change.

It should be noted that, in order to make longer the Off-Off F period after the PGoff has changed from H to L, a delay circuit may be included at the latter stage of the NOR circuit 42 of the gate voltage detection control circuit 40.

Slightly delayed, the Nch gate voltage NG2, output from the NOR2, changes from L to H (S16). This switches ON the Nch transistor N2.

Afterwards, the output signal OUT changes from L to H (S17).

According to the above operations, in any one of the switching operations, the following steps are performed: monitoring all of the gate voltages applied to the transistors; detecting that all transistors of one of the P channel and the N channel have become OFF based on the monitored gate voltages; and, after the detecting, switching the output voltage by turning ON the transistors of the other of the P channel and the N channel.

Therefore, a timing, in which all of the output transistors are OFF, is created when switching the H signal/L signal of the output signal to the load according to the change of the input signal.

With the above arrangement, it is possible to prevent occurrence of the through current when the output signal OUT changes from H to L and changes from L to H.

In the present embodiment, because the gate voltage detection control circuit 40 for detecting the gate voltages for the output transistors is added, there are Off-Off periods (timings) for the output transistors right before the output signal OUT changes from H to L, and right before the output signal OUT changes from L to H. As a result, there is no time when Pch output transistors and Nch output transistors are ON, and thus, the through current does not flow.

Further, it is possible to reliably create an Off-Off period for the output transistors by using the multiple transistors and pre-buffers with different characteristics. Therefore, even in the case where there are two series of output transistors, or where there are three or more series of output transistors, it is possible to make the sizes of the output transistors and the sizes of the transistors of the pre-buffer circuits different from each other.

As illustrated in FIG. 3, when the timing control signal PGoff is L and the timing control signal NGoff is H, all of the output transistors are OFF, and thus, no through current occurs in any of the output transistors.

Here, as illustrated in FIG. 3 to FIG. 5, in the present embodiment, it is possible to reliably create an Off-Off period for the output transistors by using the multiple transistors and pre-buffers with different characteristics.

In the following, as a comparison, a case will be discussed in which, in order to prevent a through current from flowing when switching the output signal, the switching timing adjustment of the gate voltages PG1 and PG2 is realized by using the same types of transistors and pre-buffer circuits.

Specifically, with respect to the electrical characteristics, if Pch1=Pch2, Nch1=Nch2, NAND1=NAND2, NOR1=NOR2, then, theoretically, change timings of the gate voltages applied to the output transistors are the same.

However, when the electrical characteristics are designed as described above, there is a case in which, due to the manufacturing variations, etc., the change timings of the gate voltages applied to the output transistors may vary and a through current may flow.

As another comparison, even in the case where the sizes of the output transistors are different and the pre-buffer circuit constants are different, if the gate voltages are not monitored, then, the change timings of the PG1 and PG2 may be off (may be different) and the change timings of the NG1 and NG2 may be off (may be different). In this case, a through current may flow because the Pch1 and Nch2 may be ON-ON, or, the Pch2 and Nch1 may be ON-ON.

In the present embodiment, the sizes of the output transistors are different, the circuit constants of the pre-buffers are different, and further, the gate detection control circuit for monitoring the gate voltages applied to the output transistors is included. With the above arrangement, there are Off-Off periods for the output transistors right before the output signal OUT changes from H to L and right before the output signal OUT changes from L to H, and thus, a through current does not flow because there is no time in which a Pch output transistor and a Nch output transistor are ON.

As described above, it is possible to reduce the through current in the output transistors of the I/O cell that is capable of switching the two or more output drive capabilities because, when switching the output voltage according to the input signal, the gate voltages applied to the multiple Pch transistors P1, P2, Pr and the gate voltages applied to the multiple Nch transistors N1, N2, Nr are monitored, and the output voltage is caused to change to an output according to the input signal after detecting that all of the Pch output transistors and the Nch output transistors are OFF.

Further, it is possible to reliably create an Off-Off period for the output transistors by using the multiple transistors and pre-buffers with different characteristics. Therefore, even in the case where there are two series of output transistors, or where there are three or more series of output transistors, it is possible to make the sizes of the output transistors and the sizes of the transistors of the pre-buffer circuits different from each other. It should be noted that the reference codes "A", "B" in FIG. 3 will be described later while making reference to FIG. 8.

Modified Example of the First Embodiment

In an example described above, the input signal takes two logical signals H, L, the output voltage takes three outputs: H level, L level, and high impedance level. The present invention may be applied to an I/O cell capable of switching four or more output drive capabilities.

For example, a third adjustment output circuit is provided. The third adjustment output circuit includes a third adjustment output transistor with third electrical characteristics different from the electrical characteristics of the first output transistor and the second output transistor, and a third adjustment pre-buffer, with a third circuit constant different from the first and the second circuit constants and, which forms a pair with the third adjustment output transistor (e.g., n-th output transistor, n-th pre-buffer, etc., in FIG. 1).

In this modified example, it is also possible to reduce the through current in the output transistor because the sizes of the output transistors are different, the circuit constants of the pre-buffers are different, and the gate detection control circuit, which monitors the gate voltages applied to the output transistors, is included.

It is possible to perform switching the output voltage (output drive capability) with more reliable time difference by causing the gate voltage threshold to be three levels.

Modified Example 2 of the First Embodiment

In an example illustrated in FIG. 1, as an adjustment output circuit, the first adjustment output circuit 19 and the second adjustment output circuit 29 are included. However, other than the reference output circuit 109, only one adjustment output circuit may be included. In this case, the included single adjustment output circuit may be a first adjustment output circuit 19 that has the transistor with the first electrical characteristics and the pre-buffer with the first circuit constant, the first electrical characteristics and the first circuit constant being the same as those of the reference output circuit 109, or a second adjustment output circuit 29 that has the transistor with the second electrical characteristics and the pre-buffer with the second circuit constant, the first electrical characteristics and the first circuit constant being different from those of the reference output circuit 109.

Further, in the first embodiment described above, in order to reduce the through current that may occur when the input signal IN is switched, measures have been used in which signals are synchronized by using the gate voltage detection control circuit 40. The measures have been also useful for reducing an overshoot and an undershoot when the input signal IN is switched.

However, because no measures have been provided for synchronizing the level changes of the output drive capability switching input signals (select-out signals) SO1, SO2, when the output drive capability switching input signals change, the signals may change asynchronously, and thus, there is a risk in which a positive undershoot/negative undershoot may occur in the output signal.

With respect to the above, a second embodiment will be described in which it is possible to also prevent the overshoot and the undershoot when levels of the output drive capability switching signals SO1, SO2 change.

Second Embodiment

Figure 6:
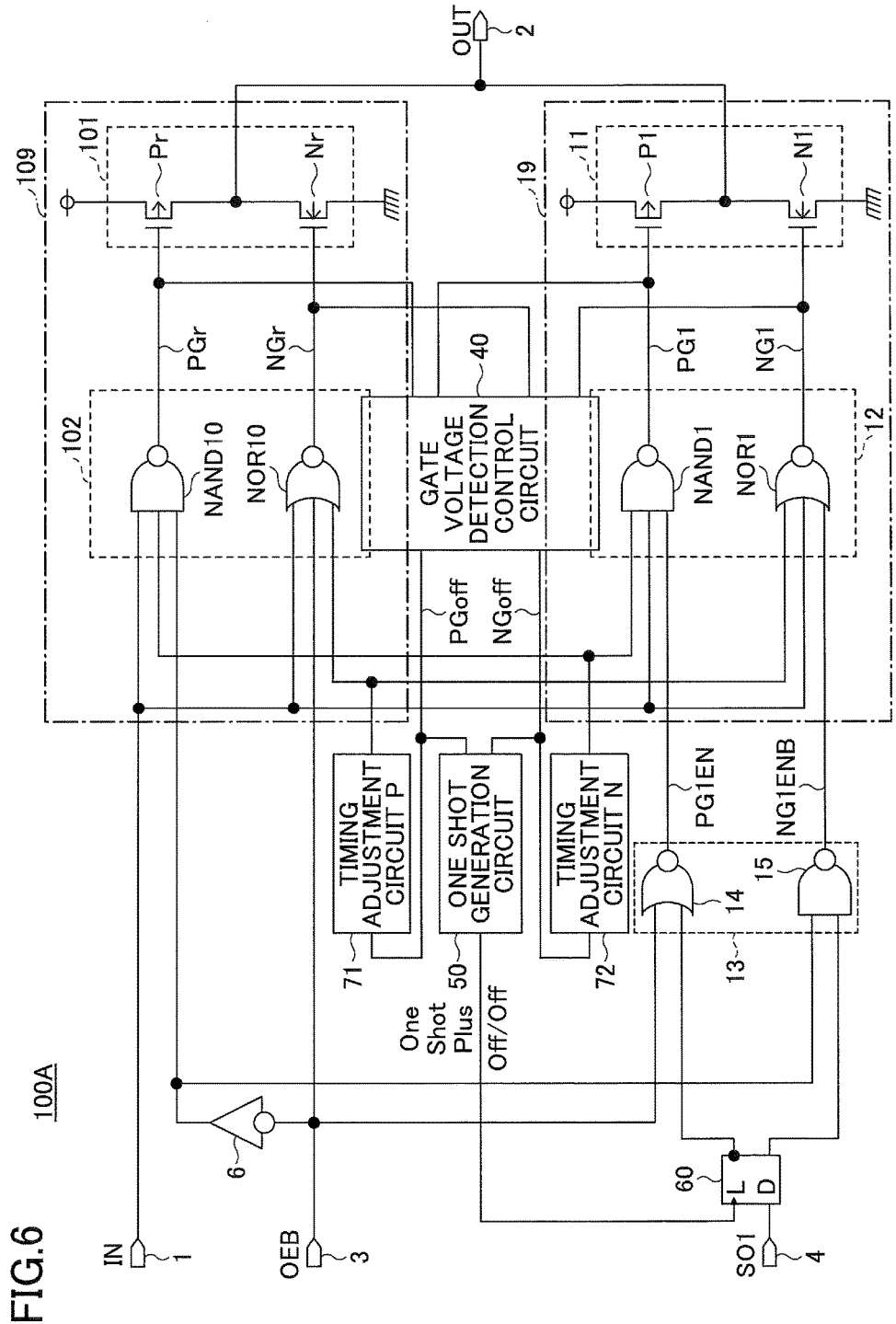
FIG. 6 is an overall circuit diagram of an I/O cell capable of switching output drive capability according to a second embodiment.

FIG. 6 is an overall circuit diagram of an I/O cell 100A capable of switching output drive capability according to a second embodiment.

The I/O cell 100A illustrated in FIG. 6 is different from the first embodiment illustrated in FIG. 1 in that a one-shot circuit 50, an output drive switching signal latch circuit 60, a P-timing adjustment circuit 71, and a N-timing adjustment circuit 72 are added.

It should be noted that FIG. 6 illustrates an example in which, as the adjustment output circuit, a single first adjustment output circuit 19 is included which has a transistor with the first electrical characteristics and a pre-buffer with the first circuit constant, the first electrical characteristics and the first circuit constant being the same as those of the reference output circuit 109 serving as a reference.

The one-shot circuit (also referred to as "one-shot generation circuit", or "one-shot pulse generation circuit") 50 outputs High when all of the Pch output transistors are OFF, or, when all of the Nch output transistors are OFF. An output signal of the one-shot circuit 50 is connected to a clock input (L input) of the output drive switching signal latch circuit 60.

The output drive switching signal latch circuit (hereinafter, referred to as "latch circuit") 60 captures a D input only when the L input is High, and retains the previously captured D input value during a period when the L input is Low.

Specifically, the latch circuit 60 captures a H/L state of the output drive capability switching signal SO1 indicating activation (H) and deactivation (L) of the first adjustment output transistor 11 only during a predetermined one-shot pulse generation period in which the output signal from the one-shot circuit 50 is H.

As described above, when the output drive capability switching signal SO1 is Low, the output current is a set current value of the reference output transistor 101, and, when the output drive capability switching signal SO1 is High, the output current is a set current value of the reference output transistor 101 plus a set current value of the first output transistor 11.

In the case where the state of the output drive capability switching signal SO1 is changed for changing the output current set value during a period when the one-shot pulse is not generated by the one-shot circuit 50, the latch circuit 60 retains the previous state until the next time when the one-shot pulse is generated. Afterwards, when the one-shot pulse is generated, the changed state of the output drive capability switching signal SO1 is output to the output control circuit 13.

The P timing adjustment circuit 71 is used for adjusting the time (Off-Off F) in which the change of the timing control signal PGoff, indicating that all of the Pch gate voltages have become High, is delayed from generation of the one-shot pulse to confirmation of corresponding signals NG1ENB/PG1EN.

The N timing adjustment circuit 72 is used for adjusting the time (Off-Off R) in which the change of the timing control signal NGoff, indicating that all of the Nch gate voltages have become Low, is delayed from generation of the one-shot pulse to confirmation of corresponding signals NG1ENB/PG1EN.

Specifically, the gate voltage detection control circuit 40 monitors gate voltages for all of the output transistors 101, 11, and, when switching the H/L state of the output voltage, create time when all of the transistors are temporarily turned OFF. At this time, the adjustment output transistor 11 receives timing control by the latch circuit 60, and thus, it can be said that the latch circuit 60 monitors the reference pre-buffer 102, which is not connected to the output drive capability switching signal SO1, via the gate voltage detection control circuit 40.

Therefore, when changing a set value of the output current of the I/O cell 100A according to the state of the output drive capability switching signal SO1, the latch circuit 60 does not switch the signal until the reference pre-buffer 102 is changed according to the change of the input signal IN.

Therefore, because the P (N) timing adjustment circuit 71 (72) adjusts the time (Off-Off F), (Off-Off R) in which the change of the timing control signal PGoff (NGoff) indicating that all of the Pch (Nch) gate voltages have become High (Low) is delayed from generation of the one-shot pulse to confirmation of corresponding signals NG1ENB/PG1EN, the output voltage OUT changes, after the switching of the output drive capability switching signal SO1, at the following change timing of the input signal IN.

According to the above, it is possible not to immediately change the output drive capability even if the output drive capability switching signal is changed during a period in which the output terminal outputs Low or High according to the input signal, but to change the output drive capability by synchronizing with the time when the output terminal changes to Low or High after an Off-Off period, and thus, a positive undershoot/negative undershoot at the output terminal is prevented from occurring.

However, in general, there is a risk in which the output drive capability is changed immediately when the output drive capability switching signal is changed during a period in which the output terminal outputs Low or High according to the input signal, and thus, a positive undershoot/negative undershoot at the output terminal occurs.

The undershoot/overshoot will be described in detail below.

Figure 7:
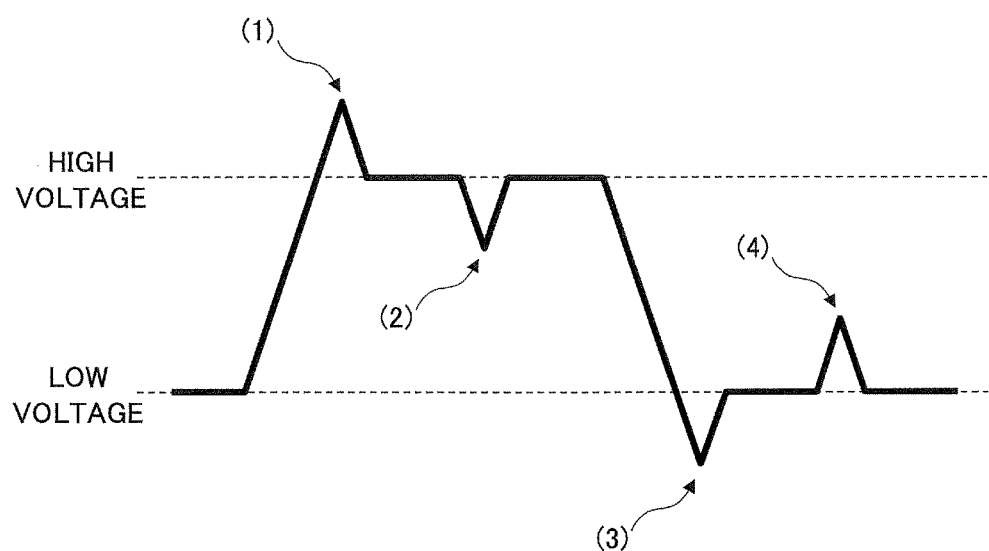
FIG. 7 is a drawing illustrating overshoot/undershoot.

FIG. 7 is a drawing illustrating an overshoot/undershoot. A positive overshoot, which is a phenomenon in which a signal goes greater than a High voltage (goes too high) when transitioning from Low to High, is illustrated by (1) in FIG. 7.

A positive undershoot, which is a phenomenon in which a signal goes less than a High voltage (goes less high) when outputting a High voltage, is illustrated by (2) in FIG. 7.

A negative overshoot, which is a phenomenon in which a signal goes less than a Low voltage (goes too low) when transitioning from High to Low, is illustrated by (3) in FIG. 7.

A negative undershoot, which is a phenomenon in which a signal goes greater than a Low voltage (goes less low) when outputting a High voltage, is illustrated by (4) in FIG. 7.

Figure 8:
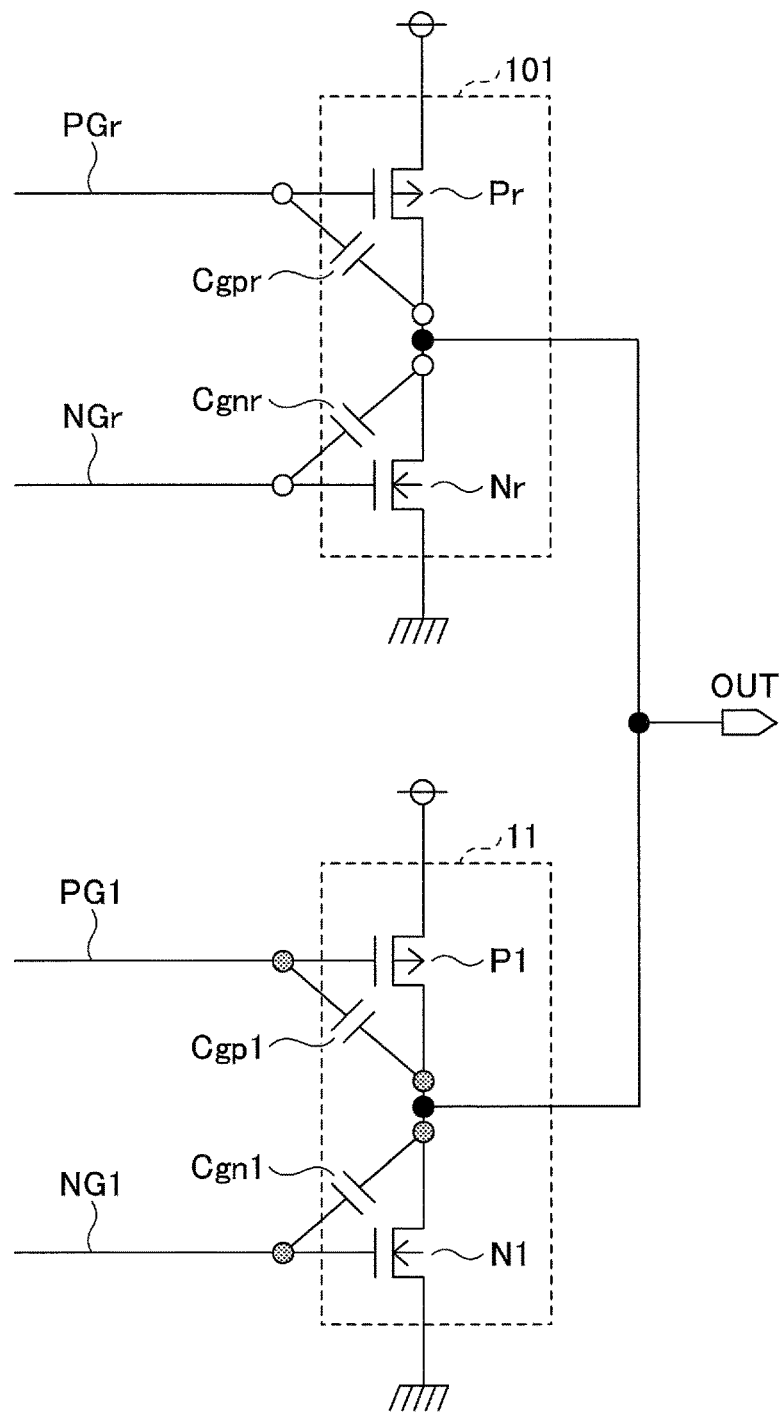
FIG. 8 is a drawing illustrating four output transistors connected to an output terminal and parasitic capacities between the gate and drain of the output transistors.

FIG. 8 is a drawing illustrating, in order to describe a risk of occurrence of a positive undershoot and a negative undershoot in FIG. 1, four output transistors (Pr, Nr, P1, N1) connected to the output terminal 2 and parasitic capacitances between the gate and drain in the output transistors.

Suppose that the output drive capability switching signal SO1 changes to H at (A) in FIG. 3. At a stage right before (A), the input signal IN is High and the control signal OEB is in an enabling state. Therefore, the gate voltages PGr, NGr, NG1 are Low, the gate voltage PG1 is High, and the output voltage OUT is High according to the Pch transistor Pr.

In this state, if the output drive capability switching signal SO1 changes from Low to High, then, the gate voltage PG1 changes from High to Low in the adjustment output circuit 19.

When the gate voltage PG1 changes from High to Low, the High output of the output OUT is lowered for a moment due to a capacitance (parasitic capacitance) Cgp1 between the gate and drain of the Pch transistor P1 of the adjustment output transistor 11. This generates a positive under shoot as illustrated by (2) in FIG. 7.

Suppose that the output drive capability switching signal SO1 changes to L at (B) in FIG. 3. At a stage right before (B), the input signal IN is Low and the control signal OEB is in an enabling state. Therefore, the gate voltages PGr, NGr, NG1 are High, the gate voltage NG1 is Low, and the output voltage OUT is Low according to the Nch transistor Nr.

In this state, if the output drive capability switching signal SO1 changes from High to Low, then, the gate voltage NG1 changes from Low to High.

When the gate voltage NG1 changes from Low to High, the Low output of the output OUT is lifted for a moment due to a capacitance (parasitic capacitance) Cgn1 between the gate and drain of the Nch transistor N1 of the adjustment output transistor 11. This generates a negative undershoot as illustrated by (4) in FIG. 7.

Figure 9:
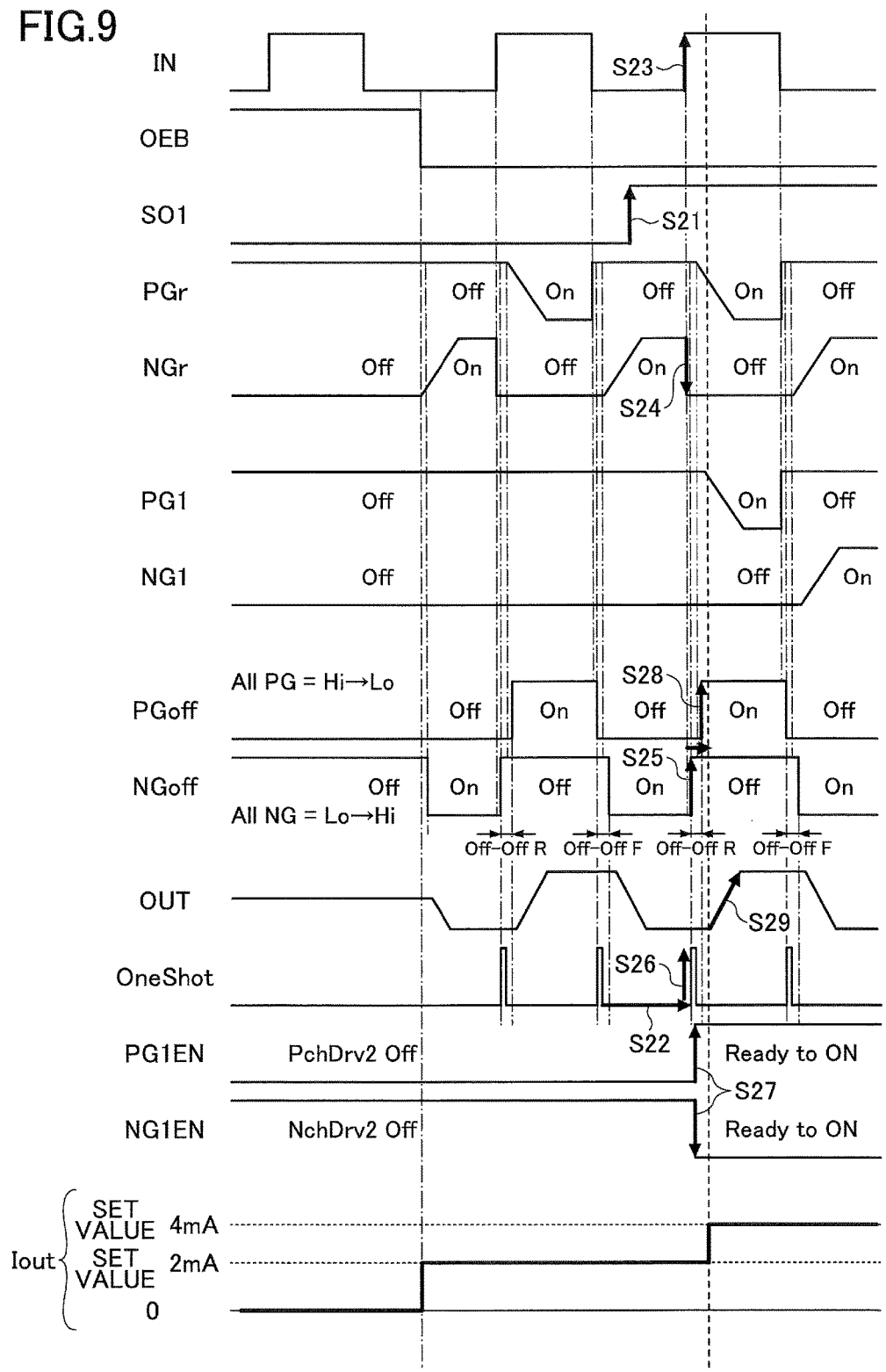
FIG. 9 is a timing chart illustrating changes of signals illustrated in FIG. 6.
Figure 10:
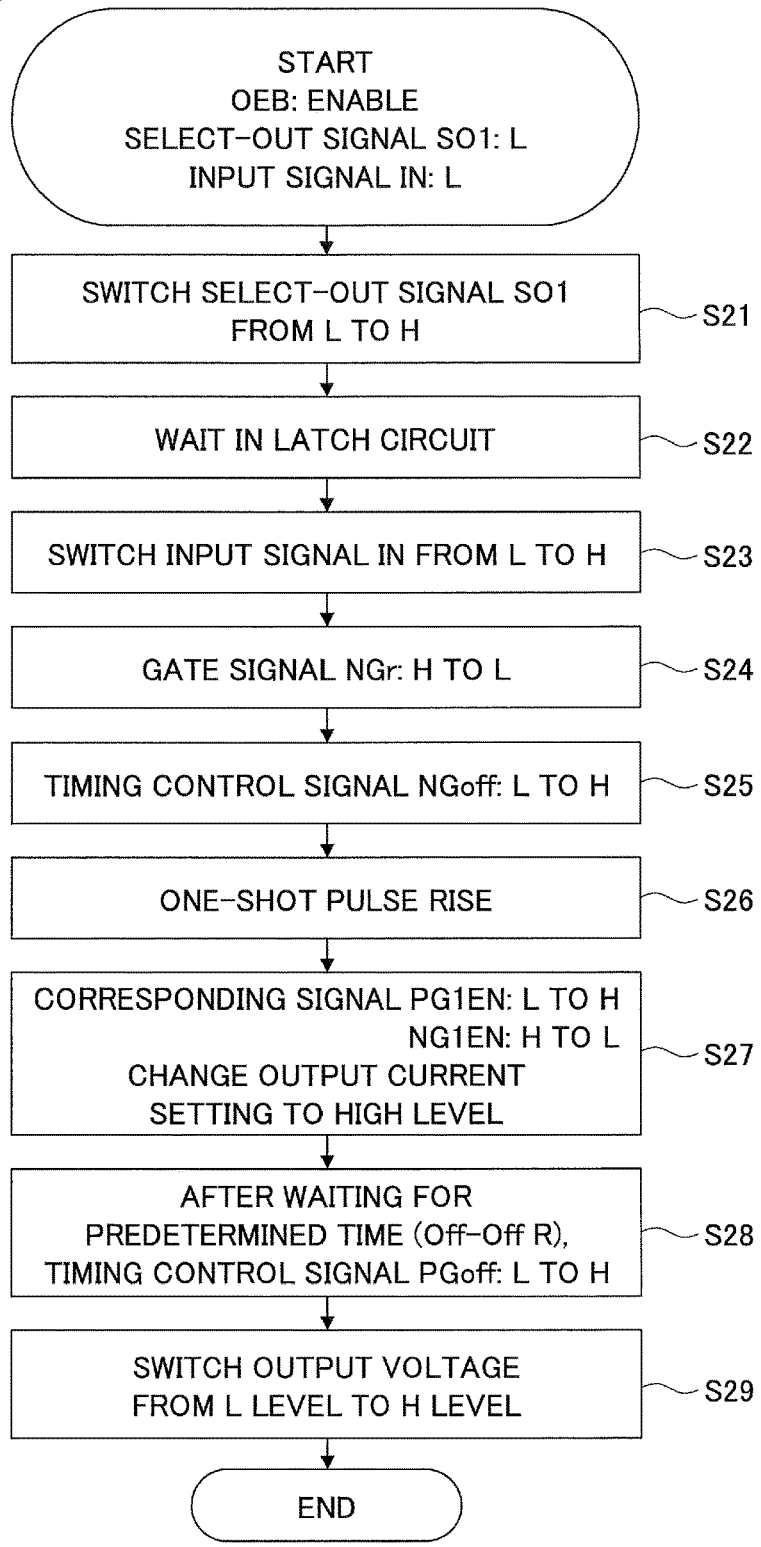
FIG. 10 is a flowchart of an operation for switching a set value of an output current based on an output drive capability switching signal SO1.

FIG. 9 is a timing chart illustrating changes of signals in the I/O cell illustrated in FIG. 6. FIG. 10 is a flowchart of an operation for switching a set value of the output current based on the output drive capability switching signal SO1 in FIG. 9.

In FIG. 9, according to the latch circuit 60 as illustrated in FIG. 6, the changes of the gate voltages PG1 and NG1 in the adjustment output circuit 19 are delayed compared with the changes of the gate voltages PGr and NGr in the reference output circuit 109. Further, an example will be described in which the reference output transistor 101 and the adjustment output transistor 11 are 2 mA drive.

At the bottom of FIG. 9, set values of output current Iout are illustrated. In a state where the output drive capability switching signal SO1 is Low, when the control signal OEB changes from a non-enabling state to an enabling state (High to Low), the gate signal NGr changes to High and the Nch transistor Nr is turned ON, and thus, a set value of the output current Iout changes from 0 mA to 2 mA.

In a state where the control signal OEB is an enabling state and the output drive capability switching signal SO1 is Low, when the input signal IN changes from Low to High, the circuits operate in such a way that the output OUT changes from Low to High with an output current 2 mA according to the Pch transistor Pr. At this time, the gate voltage NG1 changes from High to Low, the timing control signal NGoff changes from Low to High, the gate voltage PG1 changes from High to Low, and then, the output OUT changes from Low to High.

During a series of above operations, right after the timing control signal NGoff changes from Low to High, a one shot pulse is generated and a state of the output drive capability switching signal SO1 is captured by the latch.

Further, in a state where the control signal OEB is an enabling state and the output drive capability switching signal SO1 is Low, when the input signal IN changes from High to Low, the circuits operate in such a way that the output OUT changes from High to Low with an output current 2 mA according to the Nch transistor Nr. At this time, the gate voltage PG1 changes from Low to High, the timing control signal PGoff changes from High to Low, the gate voltage NG1 changes from High to Low, and then, the output OUT changes from High to Low.

During a series of above operations, right after the timing control signal PGoff changes from High to Low, a one shot pulse is generated and a state of the output drive capability switching signal SO1 is captured by the latch.

Although the output drive capability switching signal SO1 has changed from Low to High in a period when the input signal IN is Low, a state of the output drive capability switching signal SO1 is not captured by the latch until a subsequent one shot pulse is generated.

When the input signal IN changes (in this case, changes from Low to High) right after the output drive capability switching signal SO1 has changed to High, a High state of the output drive capability switching signal SO1 is captured and, when the output OUT=High is output, a set value of the output current Tout is Pch transistors Pr+P1=4 mA.

Further, when the output drive capability switching signal SO1 is a High state and the output OUT=Low is output, a set value of the output current Iout is Nch transistors Nr+N1=4 mA.

In FIG. 9, set values of the output current Iout are illustrated. Because the load connected to the output terminal 2 is charged and discharged, when the set current value is changed, the output current value changes gradually according to the switching of the output transistors.

Here, an operation, when the output drive capability switching signal SO1 changes from Low to High during a period when the input signal IN is Low, will be described in detail while making reference to FIG. 9 and FIG. 10.

In this operation, when the output drive capability switching signal SO1 changes from Low to High (S21), the latch circuit 60 waits without immediately capturing the signal (S22).

Afterwards, when the input signal IN changes from Low to High (S23), the Nch gate signal NGr in the reference output circuit 109 changes from High to Low (S24).

Further, in this state, the change of the output drive capability switching signal SO1 from Low to High has not been reflected in the latch circuit 60, and thus, the first adjustment output transistor 11 is kept deactivated corresponding to the Low state of the output drive capability switching signal SO1. The gate voltage detection control circuit 40 outputs a H level Pch timing control signal NGoff as soon as the Nch gate voltage NGr in the reference output circuit 109 changes to Low. In other words, as soon as the Nch transistor Nr is turned OFF due to the change of the input signal IN from Low to High, the timing control signal NGoff changes from Low to High (S25).

Afterwards, due to the change of the input timing control signal NGoff from Low to High, a one shot pulse rises in the one shot circuit 50 (S26). This causes the latch circuit 60 to capture the output drive capability switching signal SO1 that has changed from Low to High. A corresponding signal PG1EN output from the output control circuit 13 is changed from High to Low and NG1EN is changed from Low to High (S27).

In this way, when the change of the output drive capability switching signal SO1 from Low to High is captured, a set value of the output current of the I/O cell 100A increases to a total of an output value of the reference output transistor 101 and an output value of the first adjustment output transistor 11.

Further, from the point when the input timing control signal NGoff has changed from Low to High, after delayed by the Pch timing adjustment circuit 71 (Off-Off R), the timing control signal PGoff changes from Low to High (S28).

Afterwards, the output signal OUT changes from Low to High (S29).

As described above, even if the output drive capability switching signal SO1 changes the H/L level at a timing different from that of the change of the input signal IN, because the signal is latched until the change of the input signal, it is possible to output the signal in accordance with the change of the input signal.

Therefore, even if the output drive capability switching signal is changed during a period when Low or High is being output, the output drive capability does not change immediately and a positive undershoot/negative undershoot at the output terminal does not occur.

Modified Example of the Second Embodiment

Figure 11:
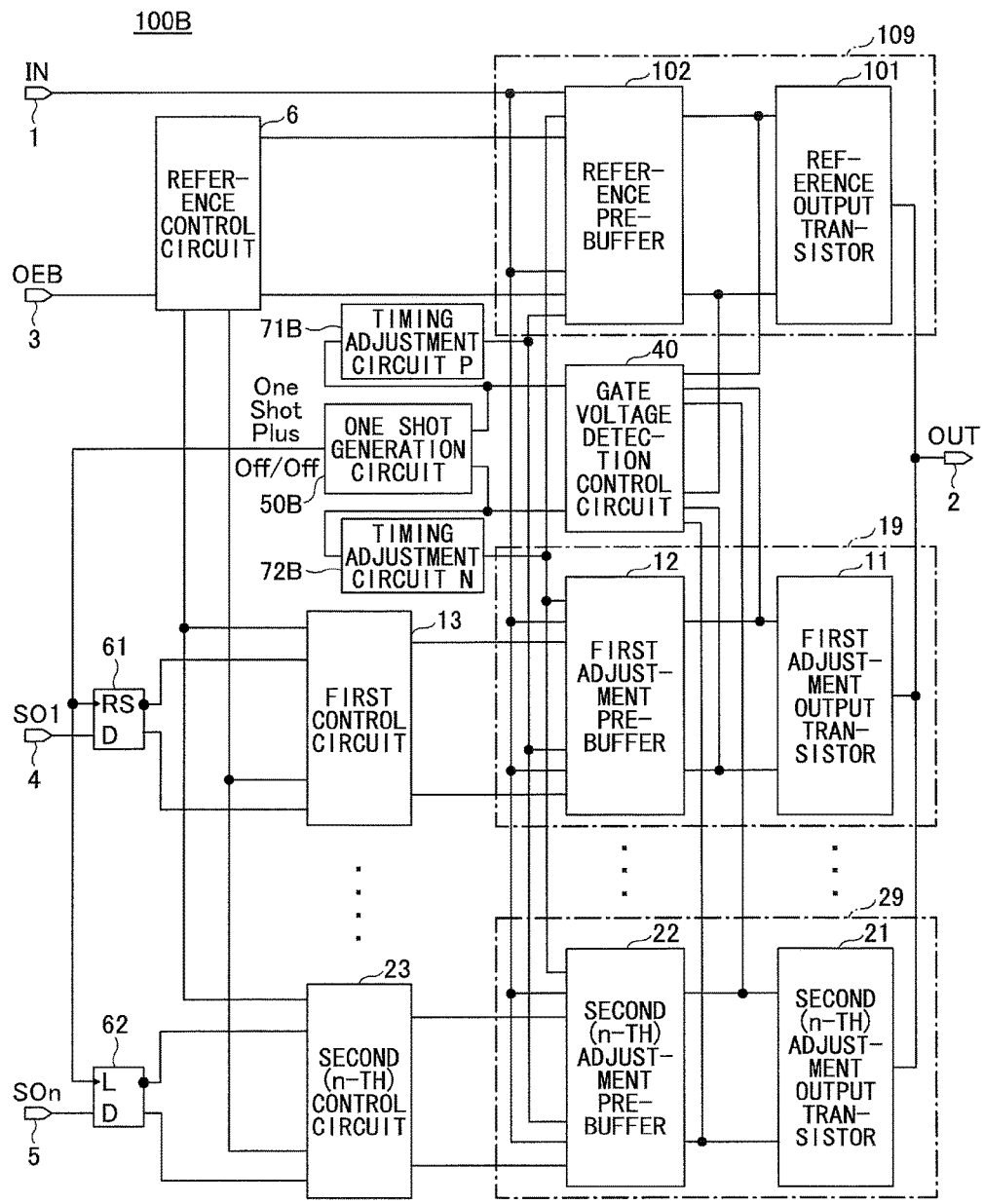
FIG. 11 is an overall block diagram of an I/O cell according to the second embodiment in the case where multiple adjustment circuits are included.

FIG. 11 illustrates a modified example of the second embodiment. Specifically, FIG. 11 is an overall block diagram of an I/O cell 100B in which multiple adjustment output circuits are included in the I/O cell 100A according to the second embodiment.

Referring to FIG. 6, an example has been described in which there is only one adjustment output circuit. In the present embodiment, multiple adjustment output circuits may be included as included in the first embodiment.

As illustrated in FIG. 11, even in the case where the number of the adjustment output circuits is increased, the numbers of the one shot circuit 50B, Pch timing adjustment circuit 71B, and the Nch timing adjustment circuit 72B do not change.

When the number of the adjustment output circuits is increased, the number of the latch circuits increases according to the numbers of the adjustment output circuits and the output control circuits. In the following, only points different from FIG. 6 will be described.

In this case, the first output drive capability switching signal SO1 and the second output drive capability switching signal SO2 for indicating activation/deactivation of the first adjustment output transistor 11 and the second adjustment output transistor 21 are input from an external circuit connected to the I/O cell 100B.

A first latch circuit 61 latches the first output drive capability switching signal SO1 and outputs the latched signal to the first adjustment pre-buffer 12 via the first output control circuit 13. A second latch circuit 62 latches the second output drive capability switching signal SO2 and outputs the latched signal to the second adjustment pre-buffer 22 via the second output control circuit 23.

In FIG. 11, the one shot circuit 50B generates a timing for the first latch circuit 61 and the second latch circuit 62 to latch the output drive capability switching signals SO1, SO2.

Further, arranged locations of the timing adjustment circuits 71B, 72B are not changed. However, it is preferable that, for example, the number of inverters included in the timing adjustment circuits may be increased compared with FIG. 6 so that the multiple stage timing adjustment can be made.

Also in FIG. 11, even if the H/L levels of the output drive capability switching signals SO1, SO2 are changed at timings different from the timing of the change of the input signal IN, because the signals are latched by the latch circuits 61, 62 until the change of the input signal, it is possible to output the latched signal in accordance with the change of the input signal.

Therefore, even if the output drive capability switching signals are changed during a period when Low or High is being output, the output drive capability does not change immediately and a positive undershoot/negative undershoot at the output terminal can be avoided.

Although embodiments of the present invention have been described above, the present invention is not limited to the embodiments described above. Various modifications and variations including combinations of a part or all of the other embodiments may be possible within a range of the scope of the present invention.

The present application is based on and claims the benefit of priority of Japanese Priority Application No. 2016-137124 filed on Jul. 11, 2016. and Japanese Priority Application No. 2017-052532 filed on Mar. 17, 2017, the entire contents of which are hereby incorporated herein by reference.

What is claimed is:

1. An I/O cell capable of switching an output current, including an input terminal to which an input signal is input, an output terminal to which a load is connected, and an enabling terminal to which a control signal, which indicates whether the output current should be in a high impedance state or should be a H/L level according to a H/L level of a logical value of the input signal, is input, the I/O cell comprising:
    a reference output circuit including a reference output transistor with first electrical characteristics, connected to the output terminal, and including a reference pre-buffer with a first circuit constant, connected to the enabling terminal, which drives the reference output transistor according to the input signal of the input terminal and the control signal of the enabling terminal;
    one or more adjustment output circuits including an adjustment output transistor with electrical characteristics that are the same as or different from the first electrical characteristics, connected to the output terminal and connected in parallel with the reference output transistor, and including an adjustment pre-buffer with a circuit constant that is the same as or different from the first circuit constant, the adjustment pre-buffer driving the adjustment output transistor according to the input signal of the input terminal; and
    a gate voltage detection control circuit monitoring gate voltages applied to all of the output transistors in the reference output circuit and the adjustment output circuits, wherein
    the gate voltage detection control circuit generates a timing for causing all of the output transistors to be turned OFF when switching the H/L level of the output current for the load according to the H/L level change of the logical value of the input signal.

2. The I/O cell according to claim 1, wherein the adjustment output circuit includes a first adjustment output circuit including a first adjustment output transistor with electrical characteristics that are the same as or different from the first electrical characteristics, connected to the output terminal and connected in parallel with the reference output transistor, and including a first adjustment pre-buffer with a circuit constant that is the same as the first circuit constant, the first adjustment pre-buffer driving the first adjustment output transistor according to the input signal of the input terminal.

3. The I/O cell according to claim 2, further comprising:
    an output control circuit, to which an output drive capability switching signal indicating activation or deactivation of the adjustment output transistor is input from an external circuit connected to the I/O cell, which circuit outputs a signal corresponding to the control signal to the adjustment pre-buffer when the output drive capability switching signal and the control signal are input and the activation of the adjustment output transistor is indicated.

4. The I/O cell according to claim 3, further comprising:
    a latch circuit latching the output drive capability switching signal and outputting the latched signal to the adjustment pre-buffer via the output control circuit; and
    a one shot circuit generating a timing for latching the output drive capability switching signal.

5. The I/O cell according to claim 4, wherein the reference output transistor and the one or more adjustment output transistors each include a Nch transistor and a Pch transistor, wherein the gate voltage detection control circuit, when changing the output current from H to L according to the switching of the input signal from H to L, outputs a Nch timing control signal to the reference pre-buffer and to the one or more adjustment pre-buffers to cause the Nch gate voltage applied to the Nch transistor to be H after all of the Pch gate voltages applied to the Pch transistors have become H,
    the I/O cell further comprising: a Pch timing adjustment circuit delaying a change of the Nch timing control signal.

6. The I/O cell according to claim 4, wherein the reference output transistor and the one or more adjustment output transistors each include a Nch transistor and a Pch transistor, wherein the gate voltage detection control circuit, when changing the output current from L to H according to the switching of the input signal from L to H, outputs a Pch timing control signal to the reference pre-buffer and to the one or more adjustment pre-buffers to cause the Pch gate voltage applied to the Pch transistor to be L after all of the Nch gate voltages applied to the Nch transistors have become L,
    the I/O cell further comprising: a Nch timing adjustment circuit delaying a change of the Pch timing control signal.

7. The I/O cell according to claim 1, wherein the adjustment output circuit includes a second adjustment output circuit including a second adjustment output transistor with second electrical characteristics that are different from the first electrical characteristics, connected to the output terminal and connected in parallel with the reference output transistor, and including a second adjustment pre-buffer with a second circuit constant that is different from the first circuit constant, the second adjustment pre-buffer driving the second adjustment output transistor according to the input signal of the input terminal.

8. The I/O cell according to claim 1, wherein the adjustment output circuit includes
    a first adjustment output circuit including a first adjustment output transistor with electrical characteristics that are the same as the first electrical characteristics, connected to the output terminal and connected in parallel with the reference output transistor, and including a first adjustment pre-buffer with a circuit constant that is the same as the first circuit constant, the first adjustment pre-buffer driving the first adjustment output transistor according to the input signal of the input terminal, and
    a second adjustment output circuit including a second adjustment output transistor with second electrical characteristics that are different from the first electrical characteristics, connected to the output terminal and connected in parallel with the reference output transistor and the first adjustment output transistor, and including a second adjustment pre-buffer with a second circuit constant that is different from the first circuit constant, the second adjustment pre-buffer driving the second adjustment output transistor according to the input signal of the input terminal.

9. The I/O cell according to claim 8, wherein a first output drive capability switching signal and a second output drive capability switching signal respectively indicating activation or deactivation of the first adjustment output transistor and the second adjustment output transistor are input from an external circuit connected to the I/O cell, the I/O cell further comprising:
- a first output control circuit which outputs a signal corresponding to the control signal to the first adjustment pre-buffer when the first output drive capability switching signal and the control signal are input and the activation of the first adjustment output transistor is indicated; and
- a second output control circuit which outputs a signal corresponding to the control signal to the second adjustment pre-buffer when the second output drive capability switching signal and the control signal are input and the activation of the second adjustment output transistor is indicated.

10. The I/O cell according to claim 9, further comprising:
a first latch circuit latching the first output drive capability switching signal and outputting the latched signal to the first adjustment pre-buffer via the first output control circuit;
a second latch circuit latching the second output drive capability switching signal and outputting the latched signal to the second adjustment pre-buffer via the second output control circuit; and
a one shot circuit generating a timing for latching the first output drive capability switching signal and/or the second output drive capability switching signal in the first latch circuit and the second latch circuit.

11. The I/O cell according to claim 8, wherein the adjustment output circuit further includes
a third adjustment output circuit including a third adjustment output transistor with third electrical characteristics that are different from the first electrical characteristics and the second electrical characteristics, connected to the output terminal and connected in parallel with the reference output transistor, the first adjustment output transistor, and the second adjustment output transistor, and including a third adjustment pre-buffer with a third circuit constant that is different from the first circuit constant and the second circuit constant, the third adjustment pre-buffer driving the third adjustment output transistor according to the input signal of the input terminal.

12. The I/O cell according to claim 1, wherein a control signal, which indicates whether the output current should be a high impedance state or should be a H/L level according to a logical value of the input signal, is input to the I/O cell, and, when the control signal indicates that the output current should be a H/L level according to a logical vale of the input signal, the reference pre-buffer and the adjustment pre-buffer are controlled according to the logical value of the input signal.

13. The I/O cell according to claim 1, wherein the reference output transistor and the one or more adjustment output transistors each include a Nch transistor and a Pch transistor, and wherein the gate voltage detection control circuit, when changing the output current from H to L according to the switching of the input signal from H to L, outputs a Nch timing control signal to the reference pre-buffer and to the one or more adjustment pre-buffers to cause a Nch gate voltage applied to the Nch transistor to be H after all of Pch gate voltages applied to the Pch transistors have become H.

14. The I/O cell according to claim 1, wherein the reference output transistor and the one or more adjustment output transistors each include a Nch transistor and a Pch transistor, and wherein the gate voltage detection control circuit, when changing the output current from L to H according to the switching of the input signal from L to H, outputs a Pch timing control signal to the reference pre-buffer and to the one or more adjustment pre-buffers to cause a Pch gate voltage applied to the Pch transistor to be L after all of Nch gate voltages applied to the Nch transistors have become L.

15. The I/O cell according to claim 1, wherein the reference output transistor and the one or more adjustment output transistors each include a Nch transistor and a Pch transistor, wherein the gate voltage detection control circuit, when changing the output current from H to L according to the switching of the input signal from H to L, outputs a Nch timing control signal to the reference pre-buffer and to the one or more adjustment pre-buffers to cause a Nch gate voltage applied to the Nch transistor to be H after all of Pch gate voltages applied to the Pch transistors have become H, wherein the gate voltage detection control circuit, when changing the output current from L to H according to the switching of the input signal from L to H, outputs a Pch timing control signal to the reference pre-buffer and to the one or more adjustment pre-buffers to cause the Pch gate voltage applied to the Pch transistor to be L after all of the Nch gate voltages applied to the Nch transistors have become L, and wherein the gate voltage detection control circuit includes a detection NAND circuit that outputs a L level Nch timing control signal when all of the Pch gate voltages applied to the Pch transistors are input and all of the Pch gate voltages are H, and includes a detection NOR circuit that outputs a H level Pch timing control signal when all of the Nch gate voltages applied to the Nch transistors are input and all of the Nch gate voltages are L.

16. The I/O cell according to claim 15, wherein the gate voltage detection control circuit includes a delay circuit that delays an output of the Nch timing control signal and a delay circuit that delays an output of the Pch timing control signal, and generates a predetermined period in which all of the transistors are caused to be temporarily OFF.

17. The I/O cell according to claim 15, wherein the reference pre-buffer and the one or more adjustment pre-buffers each include a NAND circuit, to which the input signal, the control signal or a signal corresponding to the control signal, and the Pch timing control signal are input, which circuit outputs the Pch gate voltage applied to the Pch transistor, and include a NOR circuit, to which the input signal, the control signal or a signal corresponding to the control signal, and the Nch timing control signal are input, which circuit outputs the Nch gate voltage applied to the Nch transistor.

18. An output switching method of an I/O cell that has a reference output transistor, connected to an output terminal and an enabling terminal, including a Pch transistor and a Nch transistor, and has one or more adjustment output transistors which are connected to the output terminal and connected in parallel with the reference output transistor, electrical characteristics of which are the same as or different from the electrical characteristics of the reference output transistor, and each of which include a Pch transistor and a Nch transistor, the output switching method comprising:
when switching an output voltage according to an input signal, monitoring gate voltages of all of the transistors;
detecting that all transistors of one of the Pch and Nch are turned OFF according to the monitored gate voltages; and, after the detecting, switching the output voltage by turning ON all transistors of the other of the Pch and Nch.

* * * * *